(12) United States Patent
Catalasan

(10) Patent No.: US 7,808,115 B2
(45) Date of Patent: Oct. 5, 2010

(54) TEST CIRCUIT UNDER PAD

(75) Inventor: Manolito M. Catalasan, Mission Viejo, CA (US)

(73) Assignee: Broadcom Corporation

( * ) Notice: Subject to any disclaimer, the term of this patent is extended or adjusted under 35 U.S.C. 154(b) by 435 days.

(21) Appl. No.: 10/990,122

(22) Filed: Nov. 15, 2004

(65) Prior Publication Data

US 2005/0242356 A1   Nov. 3, 2005

Related U.S. Application Data

(60) Provisional application No. 60/568,055, filed on May 3, 2004.

(51) Int. Cl.
*H01L 23/52* (2006.01)
*H01L 23/48* (2006.01)
*H01L 29/40* (2006.01)

(52) U.S. Cl. .................. 257/781; 257/E23.02; 257/758; 257/784; 257/786; 327/563

(58) Field of Classification Search ................. 257/620, 257/734, 737, 758, E33.066, E23.02, E27.11, 257/781, 786, 784, 202, 203, 206, 207, 48; 327/563
See application file for complete search history.

(56) References Cited

U.S. PATENT DOCUMENTS

| | | | | |
|---|---|---|---|---|
| 4,541,067 A | * | 9/1985 | Whitaker | 326/113 |
| 6,133,637 A | * | 10/2000 | Hikita et al. | 257/777 |
| 6,297,563 B1 | * | 10/2001 | Yamaha | 257/781 |
| 6,307,271 B1 | * | 10/2001 | Nakamura | 257/786 |

(Continued)

FOREIGN PATENT DOCUMENTS

EP    1017094    7/2000

(Continued)

*Primary Examiner*—Chris C Chu
(74) *Attorney, Agent, or Firm*—McAndrews, Held & Malloy, Ltd.

(57) ABSTRACT

Aspects of the present invention relate to the arrangement of points of interconnection of integrated circuit die to the package in which they are enclosed. More specifically, aspects of the present invention pertain to an arrangement of bond pads over the active circuitry of an integrated circuit die, in order to permit a reduction in size of the die. An embodiment of the present invention may place a first bond pad over the active area of an integrated circuit, wherein the first bond pad is electrically coupled to a second bond pad outside of the active area of the integrated circuit. Production and delivery of the integrated circuit may proceed using the second bond pad during packaging, in parallel with the testing of packaging using the first bond pad. When processes related to the use of the first bond pad have been proven successful and sustainable, the second bond pad may be eliminated, resulting in a reduction of the size of the integrated circuit device. This approach may be employed to save die area, increasing the number of devices that may be produced on a silicon wafer, resulting in a reduction in device cost. The approach of the present invention works well whether the chip is pad or core limited. Although reference has been made to the used of this technique on a silicon wafer, an embodiment of the present invention may be employed in the fabrication of integrated circuit device using other materials as well, without departing from the spirit and scope of the present invention.

13 Claims, 6 Drawing Sheets

U.S. PATENT DOCUMENTS

| | | | | |
|---|---|---|---|---|
| 6,433,628 B1 * | 8/2002 | Morris | ........................ | 327/565 |
| 6,531,709 B1 * | 3/2003 | Kim et al. | ...................... | 257/48 |
| 6,762,499 B2 * | 7/2004 | Nakadaira | ................... | 257/758 |
| 2002/0050406 A1 | 5/2002 | Yamashita | | |
| 2003/0032263 A1 * | 2/2003 | Nagao et al. | ................. | 438/462 |
| 2005/0223289 A1 * | 10/2005 | Ho | ............................... | 714/30 |

FOREIGN PATENT DOCUMENTS

| | | |
|---|---|---|
| EP | 1294017 | 3/2003 |
| JP | 2001358169 A | * 12/2001 |

* cited by examiner

US 7,808,115 B2

TEST CIRCUIT UNDER PAD

RELATED APPLICATIONS

The present application makes reference to, claims priority to, and claims benefit of U.S. Provisional Patent Application Ser. No. 60/568,055 entitled "Test Circuit Under Pad", filed May 3, 2004, the complete subject matter of which is hereby incorporated herein by reference, in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Integrated circuits (ICs) are typically fabricated with rows of input/output (I/O) pads positioned between the edge of the die and the active circuit area. The layout of a typical input/output (I/O) pad has the active area of the silicon die that performs the required I/O functions connected by a conductive path to an external wire bond pad. The external wire bond pad is used to connect the active circuitry of the device to the package pins, by bonding a metal wire between the external wire bond pad and a package bond finger. The I/O pad enables the core functions of the chip to connect with external signals, and the device power supply and ground voltages. The active circuitry of the device is normally not positioned within the die area under the wire bond pad. This is because of the likelihood of damage to the integrated circuit (IC) material under the wire bond pad when the wire connecting the wire bond pad to the package bond finger is compression bonded to the die. Because the cost of an IC device is directly related to the die area of an IC, significant attention has been paid to reducing the amount of die area occupied by wire bond pads.

Efforts are under way to develop fabrication techniques referred to as circuit under pad (CUP) approaches, in which the wire bond pads are fabricated within the active area of the IC device die. In particular, one method employs redundant active circuitry next to selected wire bond pads. The purpose of the redundant circuitry is to help determine whether structural damage to the IC due to the wire bonding operation has occurred. This technique, however, is restricted to use on IC devices that are limited by the amount of circuitry in the active area, and not by the number of I/O wire bond pads needed.

This methodology works only on a non-I/O limited design, because of the need to make room for the redundant circuits that are placed next to the wire bond pad. The size of the chip remains the same whether or not the circuit under pad is used. Bonding on top of the redundant circuit may be performed to help prove that there is no structural damage. This approach may be a single-step, circuit under pad methodology, because it requires only a single all-layer mask spin. Such an implementation is inefficient, because this approach assumes that the chip is not I/O wire bond pad limited.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

Aspects of the present invention may be found in an integrated circuit bond pad arrangement comprising a first bond pad having a first exposed conductive layer disposed over a first region and relatively further from an edge of an integrated circuit die, the first region comprising active circuit components. A representative embodiment of the present invention may also comprise a second bond pad comprising a second exposed conductive layer disposed over a second region and relatively closer to an edge of the integrated circuit die, the second region being free of active circuit components. In addition, a representative embodiment of the present invention may comprise a conductive path connecting the first exposed conductive layer and the second exposed conductive layer. The second bond pad and the conductive path may be eliminated to reduce a dimension of the integrated circuit die without altering remaining circuitry of the integrated circuit. In a representative embodiment according to the present invention, the integrated circuit die may comprise silicon, and active circuit components may comprise one of a transistor, a diode, a resistor, a capacitor, an inductor, and a conductive path. The first and second bond pads may be adapted for bonding of a conductive wire, and the bonding may comprise pressure bonding.

Additional aspects of the present invention may be seen in an integrated circuit device comprising a semiconductor die having a plurality of active regions each comprising a first exposed conductive layer disposed over at least a portion of the active region. The first exposed conductive layer of each active region may be connected to a corresponding second exposed conductive layer outside of the active region, and the first and second exposed conductive regions may be adapted for bonding of a wire. The semiconductor die may comprise silicon, and each of the plurality of active regions may comprise circuitry for at least one of communicating signals into and communicating signals out of the semiconductor die. Each of the active regions may comprise one of a transistor, a diode, a resistor, a capacitor, an inductor, and a conductive path.

Yet further aspects of the present invention may be observed in an integrated circuit device for performing at least one predetermined function. Such a device may comprise a semiconductor die having a first area comprising an arrangement of active circuit components for performing the at least one predetermined function. The device may also comprise a plurality of first bond pad areas each comprising active circuit components for interfacing an associated signal at least one of to and from the first area. Each first bond pad area may have a first exposed conductive layer for communicating the associated signal. The semiconductor die may have a second area comprising a plurality of second bond pad areas each corresponding to one of the first bond pad areas, and the second bond pad areas may be free of active circuit components. Each of the second bond pad areas may comprise a second exposed conductive layer connected by an associated conductor to the exposed conductive layer of the corresponding first bond pad area, and the first and second exposed conductive layers may be adapted for bonding of a conductor. The semiconductor die may comprise silicon, and the active circuit components may comprise one of a transistor, a diode, a resistor, a capacitor, an inductor, and a conductive path. In a representative embodiment of the present invention, at least one dimension of the semiconductor die may be reduced without modifying at least one of the arrangement of active circuit components and the performance of the predetermined function, by eliminating the second area of the semiconductor die.

Still other aspects of the present invention may be found in a method of manufacturing an integrated circuit (IC) device comprising a core area and a first plurality of bond pads disposed over at least one active circuit component. Such a method may comprise creating layout information representing at least the core area, the first plurality of bond pads, and a second plurality of bond pads disposed over an area of the device that is free of active circuit components. The method may comprise packaging a first portion of a fabricated die using the first plurality of bond pads, and testing the first portion to determine whether use of the first plurality of bond pads is successful. The method may comprise modifying the layout information to remove the second plurality of bond pads, if testing is successful. The method may also comprise revising the layout information, if testing is not successful, and repeating the packaging, testing, and modifying until testing is successful. The method may comprise packaging a second portion of the fabricated die using the second plurality of bond pads, and delivering the packaged second portion to a user.

In a representative embodiment of the present invention, the integrated circuit device may comprise silicon. The packaging may comprise bonding a conductor to at least one bond pad, and the bonding may comprise pressure bonding. Active circuit components may comprise one of a transistor, a diode, a resistor, a capacitor, an inductor, and a conductive path. Each of the plurality of second bond pads may be connected by a conductive path to a corresponding one of the first plurality of bond pads. The method may also comprise packaging die using the first plurality of bond pads, if testing is successful, and delivering the die packaged using the first plurality of bond pads to a user. In addition, the method may comprise the fabricating integrated circuit (IC) die using the layout information.

These and other advantages, aspects, and novel features of the present invention, as well as details of illustrated embodiments, thereof, will be more fully understood from the following description and drawings.

DETAILED DESCRIPTION OF THE INVENTION

Aspects of the present invention relate to the arrangement of points of interconnection of an integrated circuit (IC) die to the package in which it is enclosed. More specifically, aspects of the present invention pertain to an arrangement of wire bond pads over the active circuitry of an integrated circuit die, in order to permit a reduction in size of the die. In a representative embodiment of the present invention, a dual-step, circuit under pad (CUP) methodology, referred to as test circuit under pad (TCUP), is employed. This approach does not shrink the size of the integrated circuit device (a/k/a, "chip") initially, but this approach can be implemented on input/output (I/O)-limited designs to qualify the CUP. The use of both external and internal wire bond pads (a/k/a TCUP) is unique, because it allows the parallel qualification of the CUP and delivery to the customer, using the same integrated circuit device.

A representative embodiment of the present invention may place a first wire bond pad over the active area of an integrated circuit, wherein the first wire bond pad is electrically coupled to a second wire bond pad outside of the active area of the integrated circuit. Production and delivery of the integrated circuit may proceed using the second wire bond pad during packaging, in parallel with the testing of packaging using the first wire bond pad. When processes related to the use of the first wire bond pad have been proven successful and sustainable, the second wire bond pad may be eliminated, resulting in a reduction of the size of the integrated circuit device. This approach may be employed to save die area, increasing the number of devices that may be produced on a silicon wafer, resulting in a reduction in device cost. The approach of the present invention works well whether the chip is input/output (I/O) pad or core limited. Although reference has been made to the use of this technique on a silicon wafer, a representative embodiment of the present invention may be employed in the fabrication of integrated circuit device using other materials as well, without departing from the spirit and scope of the present invention.

The terms "active area" and "active circuitry" are used herein to refer to regions or portions of an integrated circuit in which circuit components have been created during the processing of the corresponding IC wafer. For example, electrical components such as transistors, diodes, resistors, capacitors, inductors, and other current carrying structures created during the processing of semiconductor material may be considered as circuit components for the purposes of this application. In contrast, a portion or region of the IC wafer or die within which no electrical components have been created may be considered to be an "inactive area" or "inactive region".

Figure 1:
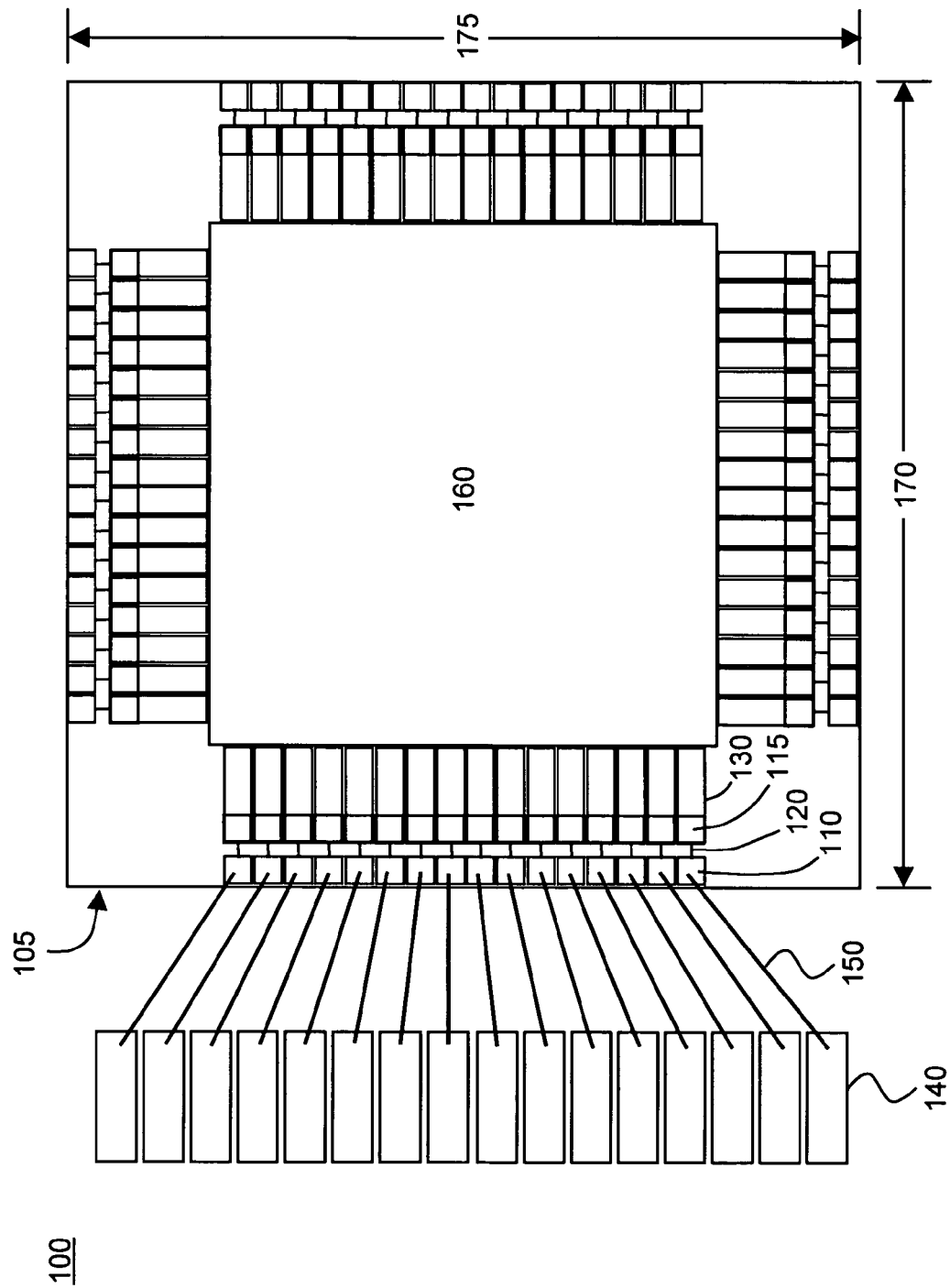
FIG. 1 shows an exemplary integrated circuit (IC) device having a plurality of internal wire bond pads each connected by a conductive path to an external wire bond pad that is used to provide an electrical connection through a wire to a package bond finger, in accordance with a representative embodiment of the present invention.

FIG. 1 shows an exemplary integrated circuit (IC) device 100 having a plurality of internal wire bond pads 115 each connected by a conductive path 120 to an external wire bond pad 110 that is used to provide an electrical connection through a wire 150 to a package bond finger 140, in accordance with a representative embodiment of the present invention. As shown in FIG. 1, the IC device 100 comprises an integrated circuit die 105 mounted within an IC package having a plurality of package bond fingers 140. The IC die 105 comprises a core area 160, surrounded by a plurality of input/output (I/O) pads 130. In a representative embodiment of the present invention, each of the I/O pads 130 comprises an internal wire bond pad 115 located over a portion of the active circuit area of the I/O pad 130, creating what may be referred to as a circuit under pad (CUP). The internal wire bond pad 115 of FIG. 1 is connected by a conductive path 120 to an external wire bond pad 110 that is outside of the active circuit area of the IC die 105. The package bonds fingers 140 are shown in FIG. 1 connected by wires 150 to the external wire bond pads 110. As shown in the illustration of FIG. 1, the IC die 105 employing the external wire bond pads 110 has the same initial X dimension (i.e., width) 170 and Y dimension (i.e., height) 175 as an IC die using a conventional design approach.

In a representative embodiment of the present invention, the CUP located beneath the internal wire bond pad 115 may be qualified in parallel with deliveries to customers, by using the external wire bond pad 110. The CUP beneath internal wire bond pad 115 may be subjected to a lengthy and rigorous qualification process, to minimize or eliminate the risk of device failure due to the stresses of wire bonding. Such failures may be monitored by testing the use of the internal wire bond pad 115 upon samples of the IC device taken from the same lots of IC devices delivered to customers. This monitoring may be accomplished, for example, by occasionally de-layering the CUP beneath the internal wire bond pads 115 onto which wire bonds have been applied, and checking for any damage to the internal wire bond pad 115 and the metal layers below it that connect to the active devices of the I/O pad 130. A representative embodiment in accordance with the present invention enables the complete evaluation of the CUP beneath the internal wire bond pads 115, independent of any customer schedule or production constraints. This is possible due to the use of the external wire bond pads 110. There is no redundant circuit under the external wire bond pads 110. This eliminates any possible risk to active circuitry due to wire bonding. The IC device 100 may be shipped immediately to customers without risk of failure in the field due to unproven CUP methodology caused by premature use of the internal wire bond pad 115. By employing a representative embodiment of the present invention, a manufacturer may continue to ship product using the external wire bond pad 110, while the qualification of the use of the internal wire bond pad 115 is in progress. No schedule risk is caused by the use of the CUP approach of the present invention.

Figure 2:
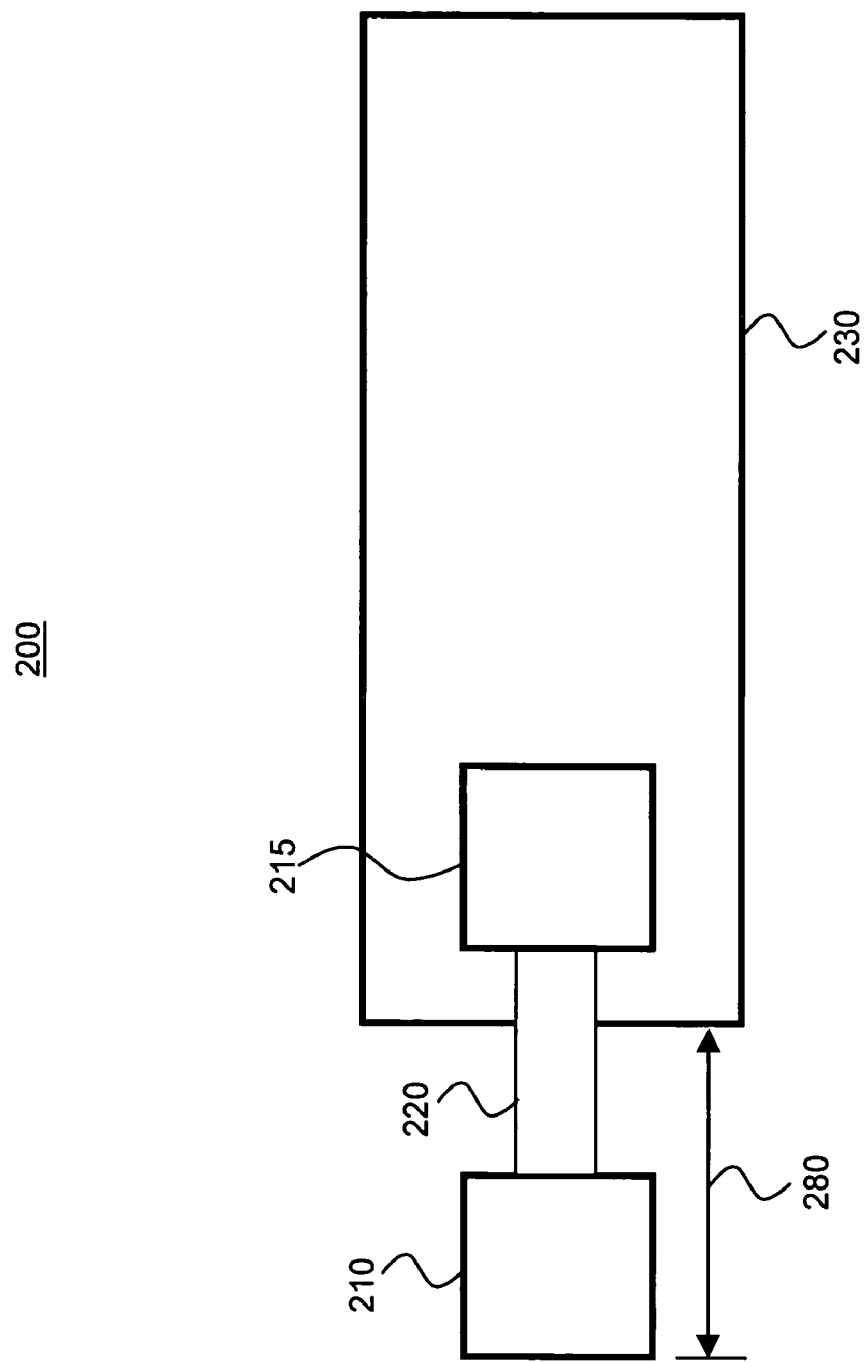
FIG. 2 illustrates the arrangement of an exemplary input/output pad structure having an internal wire bond pad that is disposed over a portion of the active area of the input/output pad, and connected by a conductive path to an external wire bond pad, in accordance with a representative embodiment of the present invention.

FIG. 2 illustrates the arrangement of an exemplary input/output pad structure 200 having an internal wire bond pad 215 that is disposed over a portion of the active area of the input/output pad 230, and connected by a conductive path 220 to an external wire bond pad 210, in accordance with a representative embodiment of the present invention. The external wire bond pad 210, internal wire bond pad 215, conducting path 220, and input/output pad 230 of FIG. 2 may correspond, for example, to the external wire bond pad 110, internal wire bond pad 115, conductive path 120, and input/output pad 130, respectively, of FIG. 1. The input/output pad 230 may comprise active circuitry used to interface active circuitry of the core portion of an IC device such as, for example, the core 160 of FIG. 1, to circuitry external to the IC device such as, for example, other integrated circuit devices, or power supply and ground connections. In a representative embodiment of the present invention, the external wire bond pad 210 is positioned within an area of an IC device beneath which there are no active components or conductive paths. The internal wire bond pad 215, however, is positioned over a portion of the active circuitry of the input/output pad 230. The conductive path 220 connects the external wire bond pad 210 to the internal wire bond pad 215. The projection 280 of the external wire bond pad 210 beyond the outer-most portion of the input/output pad 230, represents the potential reduction in the size, along one edge of an integrated circuit die such as, for example, the integrated circuit die 105 of FIG. 1, that is saved by employing the internal wire bond pad according to a representative embodiment of the present invention.

Figure 3:
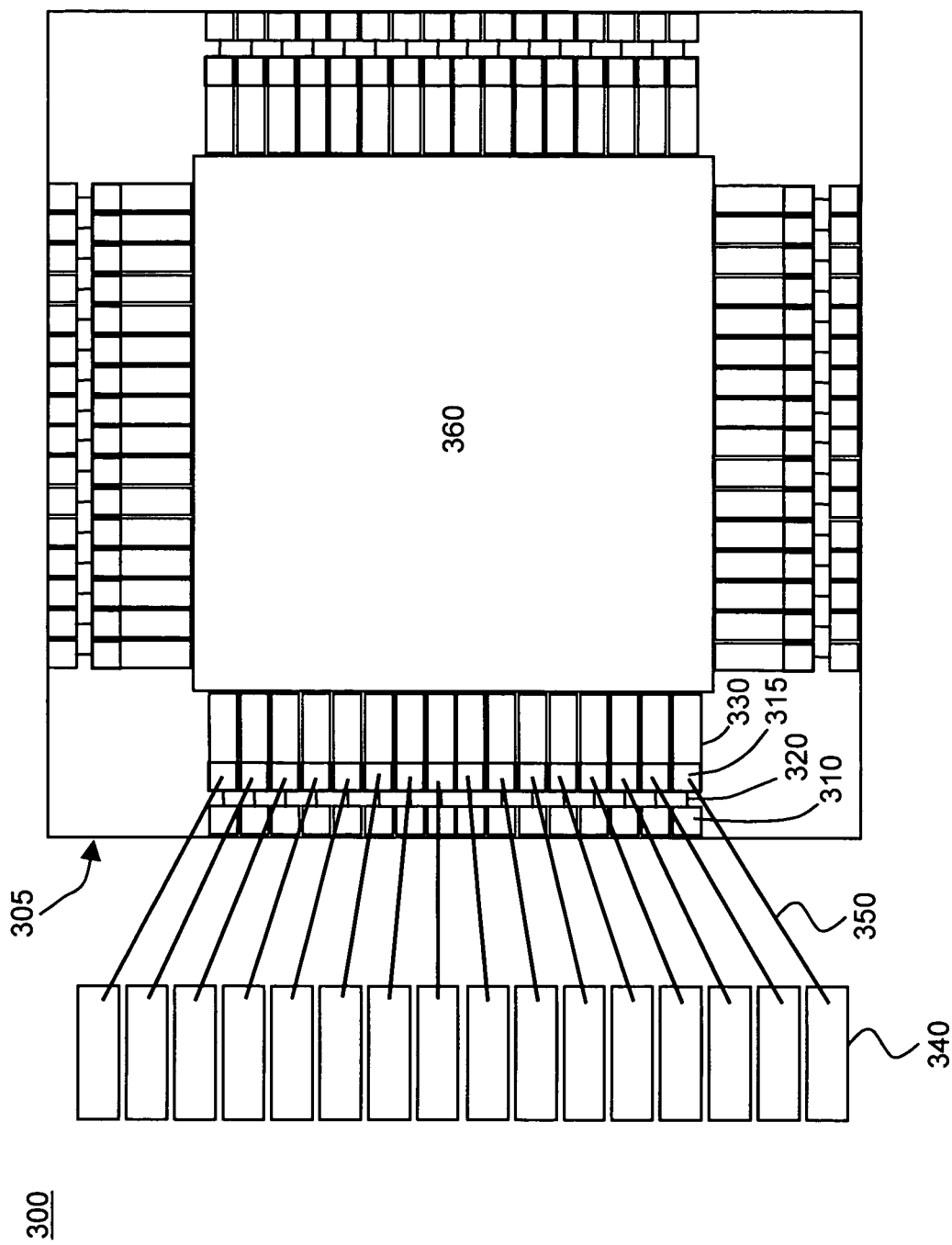
FIG. 3 shows an exemplary integrated circuit device having a plurality of internal wire bond pads each connected by a conducting path to an external bond pad, in which the internal wire bond pad is used to provide an electrical connection through a wire to a package bond finger following qualification of the circuitry under the internal wire bond pads, in accordance with an embodiment of the present invention.

FIG. 3 shows an exemplary integrated circuit device 300 having a plurality of internal wire bond pads 315 each connected by a conducting path 320 to an external bond pad 315, in which the internal wire bond pad 315 is used to provide an electrical connection through a wire 350 to a package bond finger 340 following qualification of the circuitry under the internal wire bond pads 315, in accordance with an embodiment of the present invention. As shown in the illustration of FIG. 3, the IC device 300 comprises an IC die 305 having a plurality of I/O pads 330 surrounding a core area 360. Each of the I/O pads 330 comprises an internal wire bond pad 315 connected by a wire 350 to a respective one of a plurality of package bond fingers 340. The I/O pads 330, IC core area 360, package bond fingers 340, and wires 350 of the IC device 300 shown in FIG. 3 may correspond, for example, to the I/O pads 130, IC core area 160, package bond fingers 140, and wires 150 of the IC device 100 of FIG. 1. The IC die 305 of FIG. 3 may be identical in every functional aspect to the IC die 105 of FIG. 1, with the exception of the presence of the internal wire bond pads 315 and the conductive paths 320 of FIG. 3.

The internal wire bond pad 315 and the conductive path 320 are added to the IC design of FIG. 1 to permit fabrication of an IC die that may be used both for customer delivery, using the external wire bond pads 310, and for the testing of wire bonding using the internal wire bond pads 315, that enable a later reduction in die size. Once the wire bonding process and the circuitry beneath the internal wire bond pad 315 (i.e., the CUP) are proven via testing, the external wire bond pad 310 of the TCUP arrangement may be removed, resulting in a die layout with a reduced size. Removal of the external wire bond pad 310 is a relatively low risk change to the device layout, when compared to the risk involved in modifying circuitry within the active area 330.

In a representative embodiment of the present invention, the risk of the new TCUP (i.e., internal wire bond pad) pad not working properly is limited to that caused by poor electrical design or unforeseen mechanical problems during the IC design that incorporates the internal and external wire bond pads (i.e., the first step). Because the internal wire bond pad 315 is placed over the active area of the I/O pad 330, the remaining pad ring buses may be reduced to accommodate the pad thereby affecting its current carrying capability. However, the affects upon circuit operation caused by the reduction in the pad ring buses may be resolved during the testing and qualification of the internal wire bond pad 315, and represent a separate risk from that of later testing and qualification of the use of the internal wire bond pad 315 in production devices.

The savings in IC die area provided by a representative embodiment of the present invention is significant, and as IC die sizes shrink, the die area savings for an IC die grows. For example, by employing a representative embodiment of the present invention to eliminate an external bond pad in an IC fabricated using 0.18 u technology, approximately 74 u from is removed from each side of the IC die. This represents a savings of 148 u in IC die width (e.g., X dimension 170 in FIG. 1), and 148 u in IC die height (e.g., Y dimension 175 in FIG. 1). For IC devices with small core areas, the reduction in IC die area due to the employment of a representative embodiment of the present invention is significant. For example, in the case of an existing IC device with a die size of 1486 u height by 1680 u width, a reduction in both the width and the height of the die by 148 u results in a savings of approximately 446,664 square microns of die area, or about 17.89% of the die area.

Figure 4:
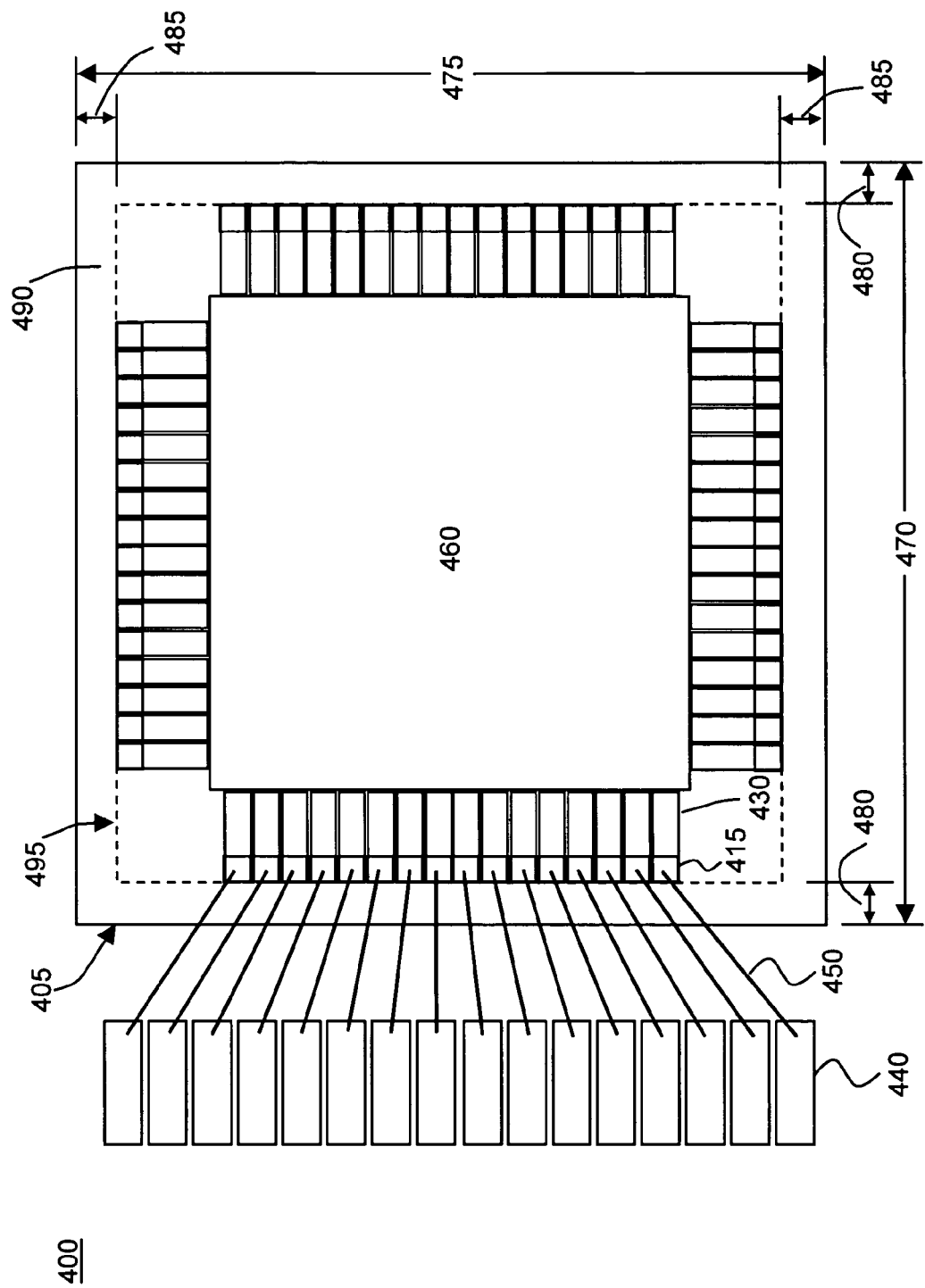
FIG. 4 illustrates the arrangement of an exemplary integrated circuit device in which the bond pad has been placed over the active area of the input/output pad, in accordance with a representative embodiment of the present invention.

FIG. 4 illustrates the arrangement of an exemplary integrated circuit (IC) device 400 in which an external wire bond pad and a conductive path such as, for example, the external wire bond pad 310 and conductive path 320 of IC device 300 of FIG. 3 have been removed during the second step of development following successful validation of the internal wire bond pad 415, in accordance with a representative embodiment of the present invention. As shown in the illustration of FIG. 4, the IC device 400 comprises an IC die 405 having a plurality of I/O pads 430 surrounding a core area 460. Each of the I/O pads 430 comprises an internal wire bond pad 415 connected by a wire 450 to a respective one of a plurality of package bond fingers 440. The I/O pads 430, IC core area 460, internal wire bond pads 415, package bond fingers 440, and wires 450 of the IC device 400 shown in FIG. 4 may correspond, for example, to the I/O pads 330, IC core area 360, internal wire bond pads 315, package bond fingers 340, and wires 350 of the IC device 300 of FIG. 3. The IC die 405 of FIG. 4 may be identical in every functional aspect to the IC die 305 of FIG. 3, with the exception of the absence of the external wire bond pads 310 and the conductive paths 320 of FIG. 3. In a representative embodiment of the present invention, the external wire bond pads 310 and the conductive paths 320 of FIG. 3 have been eliminated from the design of the IC device 405 following successful verification of the internal wire bond pads 415. The removal of the external wire bond pads and the conductive paths results in reductions 480 at the left and right edges of the width 470 of the active area of the IC die 405, and reductions 485 at the top and bottom edges of the height 475 of the active area of the IC die 405. The reduction in active area is shown in FIG. 4 as inactive die area 490. The removal of the external wire bond pads 310 and the conductive paths 320 shown in FIG. 3 permits the IC die 405 to be fabricated using the smaller active area 495 within the dashed line boundary shown in FIG. 4. By adjusting the process of fabricating the IC die 405 to eliminate the unused or inactive die area 490 of the IC die 405, a greater number of IC die 405 may be fabricated from each silicon wafer.

Figure 5:
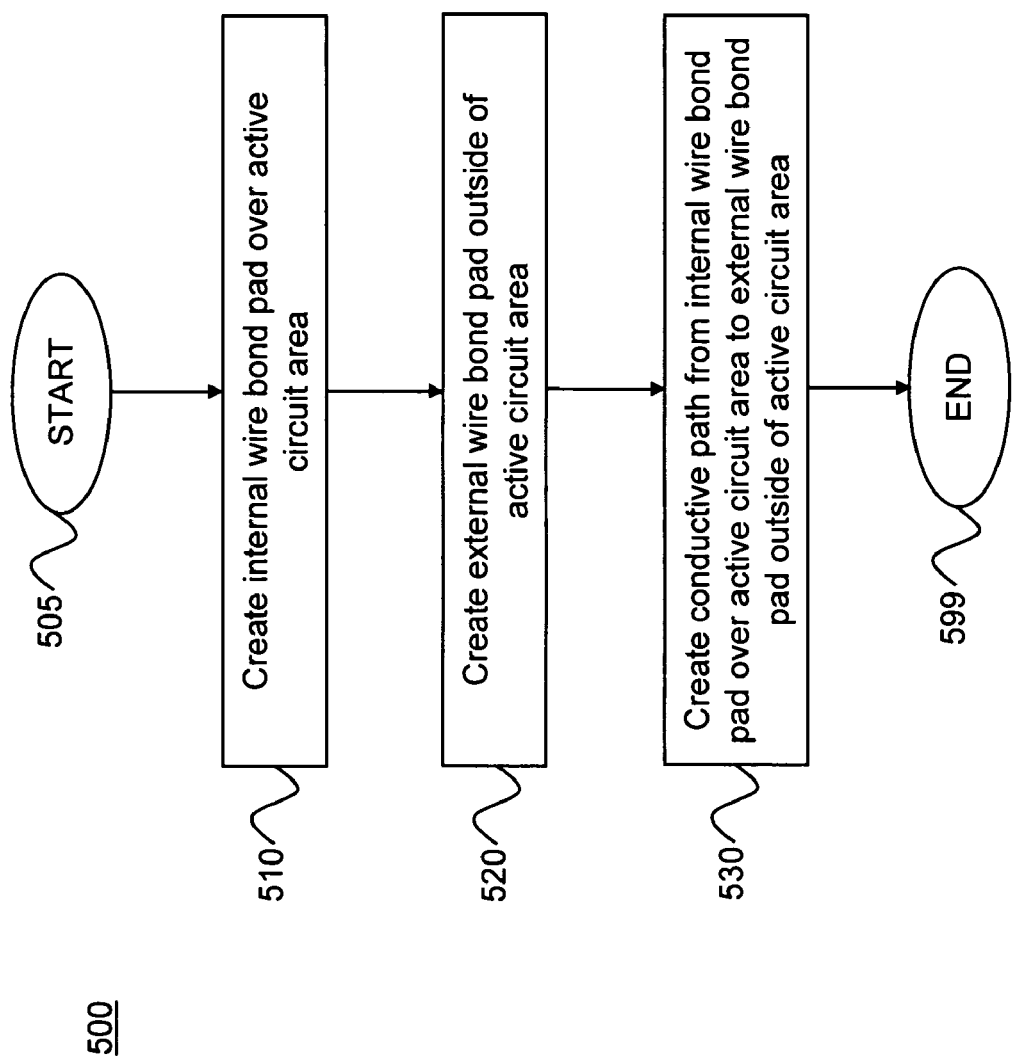
FIG. 5 illustrates a method of creating an IC design, in accordance with a representative embodiment of the present invention.

FIG. 5 shows a flowchart 500 illustrating a method of creating an integrated circuit (IC) design, in accordance with a representative embodiment of the present invention. The method of FIG. 5 begins at the start block 505. The next block 510 of the method creates a wire bond pad such as, for example, the internal wire bond pad 415 positioned over the active circuit area of an IC die such as, for example, the integrated circuit (IC) die 405 shown in FIG. 4. The next block 520 creates a wire bond pad outside of the active circuit area such as, for example, the external wire 310 of the IC die 305, shown in FIG. 3. The next block 530 creates a conductive path from the wire bond pad positioned over the active circuit area (i.e., the internal wire bond pad) to the wire bond pad positioned outside of the active circuit area (i.e., the external wire bond pad). The IC design is then ready for fabrication and testing using the TCUP methodology described above. The method ends at the end block 599.

Figure 6:
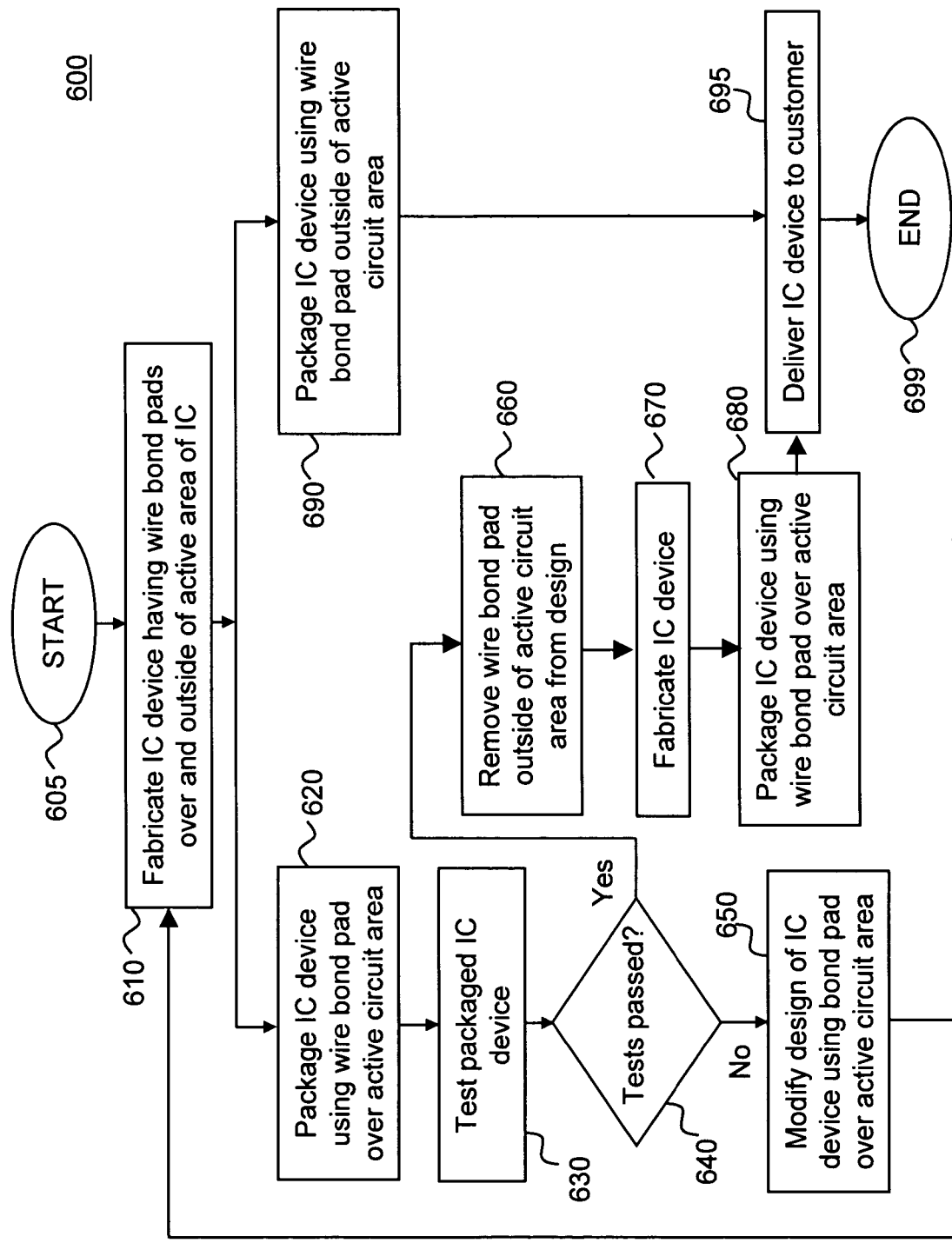
FIG. 6 illustrates a method of manufacturing an IC, in accordance with a representative embodiment of the present invention.

FIG. 6 shows a flowchart 600 illustrating a method of manufacturing an integrated circuit (IC), in accordance with a representative embodiment of the present invention. The method illustrated in FIG. 6 has two parallel paths, to illustrate that portions of the method may occur concurrently. The method begins at a start block 605. At a next block 610, an IC die such as, for example, the IC die 305 of FIG. 3 is fabricated having a wire bond pad positioned over the active circuit area (i.e., an internal wire bond pad) that is connected to a wire bond pad outside of the active circuit area (i.e., an external wire bond pad). Some of the fabricated IC die are then allocated to the activities of the left path of the flowchart 600, while the bulk of the fabricated IC die may be allocated to the activities of the right path of the flowchart 600.

In the left path of the flowchart 600, the IC die are wire bonded using the wire bond pad positioned over the active circuit area (i.e., the internal wire bond pad), at block 620. At a next block 630, the IC die wire-bonded using the internal wire bond pad are then tested. If the testing of the IC die using the internal wire bond pad passes (block 640), the wire bond pad outside of active circuit area (i.e., the external wire bond pad) is removed from the IC die design (block 660). A new version of the IC die design is then fabricated without the external wire bond pads (block 670), the IC die are wire bonded and packaged using the wire bond pad over the active circuit area (i.e., the internal wire bond pad) (block 680), and the packaged IC devices are delivered to the customer (block 690). The process then ends (block 699). If the IC die wire bonded using the internal wire bond pads do not pass testing (block 640), the design of the IC die using the bond pad positioned over active circuit area (i.e., the internal wire bond pad) is modified to correct for the failed tests (block 650), and the method returns to the fabrication of another run of IC die using the IC design with both internal and external wire bond pads (block 610). An IC designed in accordance with a representative embodiment of the present invention permits continued testing of the wire bond pad positioned over the active area (i.e., the internal wire bond pad), while it allows the manufacturer to continue to meet customer demand.

The right path of the flowchart 600 is used during the testing of the internal wire bond pad. Once an IC design is found that supports reliable and sustainable production using the internal wire bond pad, the right path is no longer needed. In the right path of the flowchart 600, the IC die allocated to customer deliveries during the testing process are wire bonded using the wire bond pad outside of the active circuit area (i.e., the external wire bond pad), at block 690. The wire bonded and packaged IC devices are then delivered to the customer, at block 695. The method of FIG. 6 then ends.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. An integrated circuit device comprising:
   a first bond pad having a first exposed conductive layer disposed over a first region comprising active circuit components;
   a second bond pad comprising a second exposed conductive layer disposed over a second region free of active circuit components, the second bond pad being disposed closer to an edge of the integrated circuit die than the first bond pad;

a conductive path connecting the first exposed conductive layer and the second exposed conductive layer; and a package bond finger directly electrically coupled to the first bond pad.

2. The arrangement according to claim 1 wherein the integrated circuit die comprises silicon.

3. The arrangement according to claim 1 wherein active circuit components comprise one of a transistor, a diode, a resistor, a capacitor, an inductor, and a conductive path.

4. The arrangement according to claim 1 wherein the first and second bond pads are adapted for bonding of a conductive wire.

5. The arrangement according to claim 4 wherein the bonding comprises pressure bonding.

6. An integrated circuit device comprising:

a semiconductor die having a plurality of active regions each comprising a first exposed conductive layer disposed over at least a portion of the active region, wherein the first exposed conductive layer of each active region is connected to a corresponding second exposed conductive layer outside of the active region, and wherein the first and second exposed conductive layers are configured for bonding of a package bond finger; and a package bond finger directly electrically coupled to the first exposed conductive layer.

7. The device according to claim 6 wherein the semiconductor die comprises silicon.

8. The device according to claim 6 wherein each of the plurality of active regions comprise circuitry for at least one of communicating signals into and communicating signals out of the semiconductor die.

9. The device according to claim 6 wherein each of the active regions comprise one of a transistor, a diode, a resistor, a capacitor, an inductor, and a conductive path.

10. An integrated circuit device for performing at least one predetermined function, the device comprising:

a semiconductor die having a first area comprising an arrangement of active circuit components for performing the at least one predetermined function, and a plurality of first bond pad areas each comprising active circuit components for interfacing an associated signal at least one of to and from the first area, each first bond pad area having a first exposed conductive layer for communicating the associated signal;

the semiconductor die having a second area comprising a plurality of second bond pad areas each corresponding to one of the first bond pad areas, each of the second bond pad areas free of active circuit components and comprising a second exposed conductive layer connected by an associated conductor to the exposed conductive layer of the corresponding first bond pad area;

the first and second bond pad areas being configured for bonding of a conductor; and a plurality of package bond fingers, each directly electrically coupled to one of the first bond pad areas.

11. The device according to claim 10 wherein the semiconductor die comprises silicon.

12. The device according to claim 10 wherein the active circuit components comprise one of a transistor, a diode, a resistor, a capacitor, an inductor, and a conductive path.

13. The device according to claim 10 wherein at least one dimension of the semiconductor die can be reduced without modifying at least one of the arrangement of active circuit components and the performance of the predetermined function, by eliminating the second area of the semiconductor die.

* * * * *